(12) United States Patent
Sheu et al.

(10) Patent No.: US 6,712,478 B2
(45) Date of Patent: Mar. 30, 2004

(54) LIGHT EMITTING DIODE

(75) Inventors: Jinn-Kong Sheu, Tainan (TW); Daniel Kuo, Tainan (TW); Samuel Hsu, Tainan (TW)

(73) Assignee: South Epitaxy Corporation, Tainan (TW)

( * ) Notice: Subject to any disclaimer, the term of this patent is extended or adjusted under 35 U.S.C. 154(b) by 0 days.

(21) Appl. No.: 10/346,843

(22) Filed: Jan. 16, 2003

(65) Prior Publication Data

US 2003/0127658 A1 Jul. 10, 2003

Related U.S. Application Data

(63) Continuation-in-part of application No. 09/940,353, filed on Aug. 27, 2001, now Pat. No. 6,515,306.

(30) Foreign Application Priority Data

Jan. 19, 2001 (TW) ........................................ 90101241 A

(51) Int. Cl.⁷ .............................................. H01L 27/15
(52) U.S. Cl. ........................... 257/79; 257/82; 257/88; 257/117; 257/184; 257/103
(58) Field of Search ............................. 257/79, 82, 88, 257/117, 184, 254, 103, 18, 22, 102, 14, 15, 99, 96

(56) References Cited

U.S. PATENT DOCUMENTS 6,093,965 A * 7/2000 Nakamura et al. .......... 257/749
6,233,265 B1 * 5/2001 Bour et al. .................... 372/45

* cited by examiner

Primary Examiner—Nathan J. Flynn
Assistant Examiner—Remmon R. Fordé
(74) Attorney, Agent, or Firm—J. C. Patents

(57) ABSTRACT

A light emitting diode with strained layer superlatices (SLS) crystal structure is formed on a substrate. A nucleation layer and a buffer layer are sequentially formed on the substrate, so as to ease the crystal growth for the subsequent crystal growing process. An active layer is covered between an upper and a lower cladding layers. The active later include III-N group compound semiconductive material. A SLS contact layer is located on the upper cladding layer. A transparent electrode is located on the contact later to serve as an anode. Another electrode layer has contact with the buffer layer, and is separated from the lower and upper cladding layers.

13 Claims, 6 Drawing Sheets

LIGHT EMITTING DIODE

CROSS-REFERENCE TO RELATED APPLICATION

This application is a continuation-in-part of prior applications Ser. No. 09/940,353, filed Aug. 27, 2001.

BACKGROUND OF THE INVENTION

1. Field of Invention

The present invention relates to light emitting device. More particularly, the present invention relates to a structure of light emitting diode having a superlattices contact layer. The light emitting diode is a nitride-base III-N group compound semiconductor device.

2. Description of Related Art

In recent years, gallium nitride-based III-N group compound semiconductor device, such as GaN, GaAlN, and GaInN, has been greatly taken as a light emitting device. FIG. 1 is a cross-sectional view, schematically illustrating structure of a conventional light emitting diode made of III-N group compound.

In FIG. 1, the light emitting diode is formed on a substrate 10, such as an $Al_2O_3$ substrate. A nucleation layer 12 and an N-type conductive buffer layer 14 are sequentially formed over the substrate 10. The buffer layer 14 includes GaN doped with N-type dopant, so as to ease the crystal growth for the subsequent crystal growing process. There is a light-emitting active layer 18 over the buffer layer 14. Usually, the active layer 18 is confined by a confinement layer, that is, cladding layers 16, 20. The cladding layers 16, 20 are doped with opposite conductive type. For example, if the lower cladding layer 16 is the GaN layer doped with N-type dopants, the upper cladding layer 20 is the GaN layer doped with P-type dopants. Then, a contact layer 22 is formed on the upper cladding layer 20. The contact layer 22 a P-type GaN layer. A transparent electrode layer 24 is formed on the contact layer 22, where the transparent electrode layer usually includes a N-type material layer, such as indium tin oxide (ITO), cadmium tin oxide (CTO), or ultra-thin metal. The transparent electrode serves as an anode of the diode. Moreover, an electrode layer 26, serving as a cathode of the diode, is also formed on the buffer layer 14 but is separated from the cladding layers 16, 20 and the active layer 18.

FIG. 2 is a cross-sectional views, schematically illustrating a light emitting region for the light emitting diode in FIG. 1. In FIG. 2, when the electrodes 24, 26 are applied with a forward bias, the diode is conducted. At this situation, current can flow from the electrode 24 to the active layer 18. In the conventional manner, the P-type contact layer 22 of GaN cannot have high carrier concentration and has large contact resistance. This results in a poor quality of current spreading. The p-type electrode layer 24 also only covers a portion of the contact layer 22. As shown in FIG. 2, the area having current flow is about the width L of the electrode layer 24. This limits the light emitting area for the diode. The function of the active layer cannot be fully performed. The light emitting efficiency of the diode is then greatly reduced.

The conventional LED using AlGaInP compound semiconductor can also be a structure as shown in FIG. 6. In FIG. 6, a substrate layer 602 is used. An n-electrode layer 600 is formed on the back side of the substrate layer 602 while a confinement layer 604 is formed on the upper side of the substrate layer 602. An active layer 606 is formed on the confinement layer 604. Another confinement layer 608 is formed on the active layer 606. Another substrate layer 610 is formed on the confinement layer 608. Then, a p-electrode 612 is form on the substrate layer 610. In this convention structure of LED, the p-electrode 612 directly contacts with the substrate 610 by only a portion. In this structure, the electrode contact is poor. As a result, the light emitting efficiency is poor either. It should be noted that the substrate layer 610 is a semiconductor layer in general.

In summary, the conventional light emitting diode is restricted by the physical properties of the contact layer. The contact layer cannot be grown with a high hole concentration. This also causes the high fabrication cost and also causes low yield. Further still, the conventional structure cannot provide a diode with high light emitting efficiency. A large portion of the active layer 18 of the diode is not well utilized. Moreover, the conductive doping types for the electrode layer and the contact layer are different. It could cause a junction between them at the contact region, and affecting the operation of the diode.

SUMMARY OF THE INVENTION

The invention provides a structure of light emitting diode, which has a contact layer having structure of doped strained-layer supperlatices (SLS), so that the contact layer can easily have a high carrier concentration, resulting in high conductivity.

The invention provides a structure of light emitting diode, which uses strained-layer supperlatices structure to serve as a contact layer associating with the transparent electrode layer, so as to improve the light emitting efficiency and reduce the operation voltage.

The invention provides a structure of light emitting diode, which has a contact layer having structure of doped strained layer supperlatices (SLS). The dopant type in the contact layer is therefore not necessary to be restricted. The transparent electrode and the contact layer can even be the same conductive type, so that the junction between the transparent electrode and the contact layer is avoided.

The invention provides a structure of light emitting diode, which has a contact layer having structure of doped strained-layer supperlatices (SLS). The transparent electrode has better contact quality. The area of the transparent electrode can be about equal to the area of the active layer. This can allow the current to flow through the larger area of the active layer, so that the effective light emitting area is increased, and the light emitting efficiency is accordingly increased.

The invention provides a structure of light emitting diode, which is formed on a substrate, wherein an SLS structures is formed over a second confinement layer.

In the foregoing, the transparent electrode layer and the SLS layer can have different conductive types. The transparent electrode layer can have the conductive type of P-type or N-type.

The invention provides a structure of light emitting diode, having an SLS structure formed on the substrate.

In the foregoing, the transparent electrode layer and the SLS layer can be the same conductive type with all P-type or all N-type. The transparent electrode layer and the SLS layer can also be different conductive type.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated In the drawings.

DESCRIPTION OF THE PREFERRED EMBODIMENTS

Figure 1:
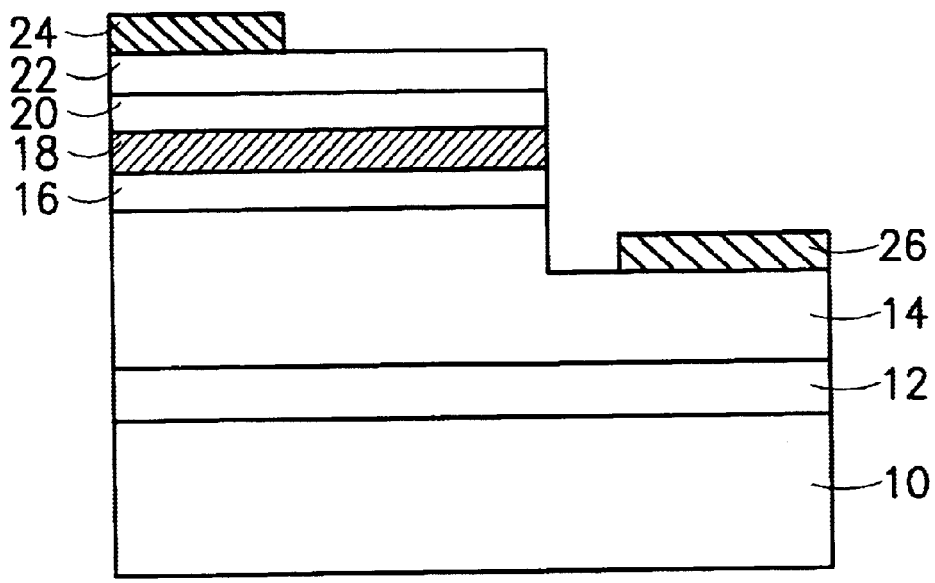
FIG. 1 is a cross-sectional view, schematically illustrating structure of a conventional light emitting diode made of III-N group compound.
Figure 2:
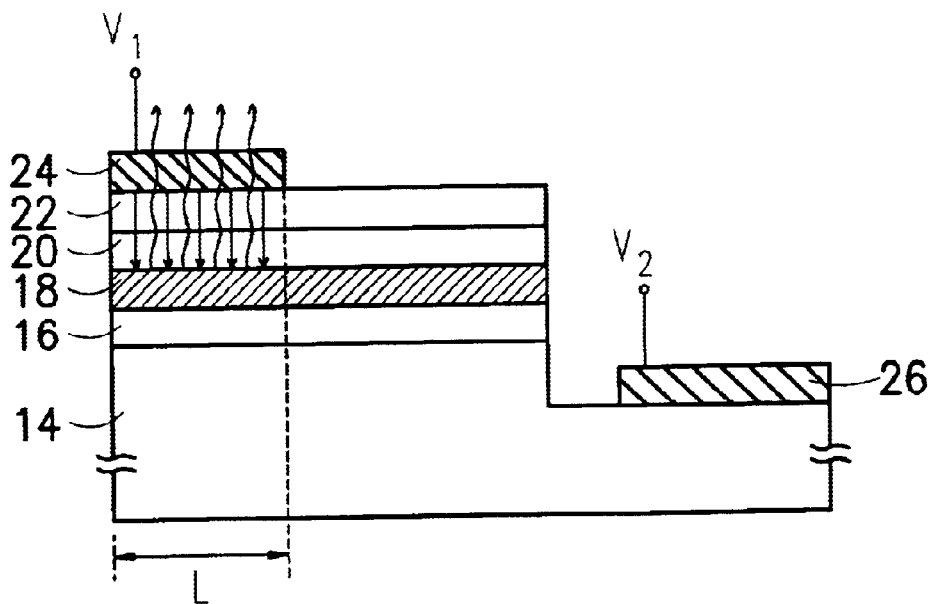
FIG. 2 is a cross-sectional views, schematically illustrating a light emitting region for the light emitting diode in FIG. 1.
Figure 3:
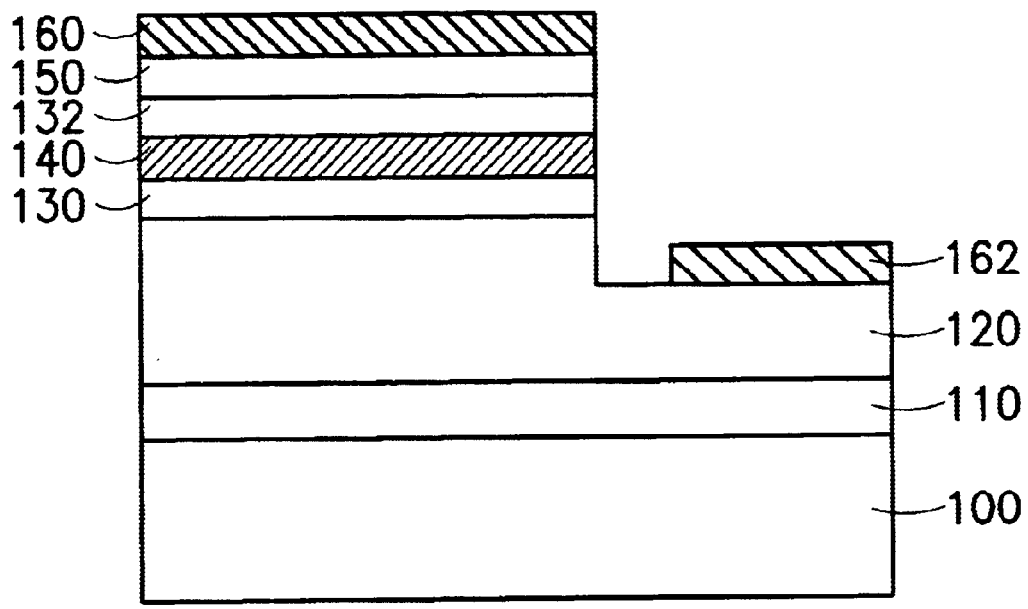
FIG. 3 is a cross-sectional view, schematically illustrating a structure of light emitting diode including nitride-based III-N group compound, according to one preferred embodiment of this invention.

The invention uses a strained-layer superlattices as a contact layer for a diode to improve the ability for growing a GaN-based semiconductor layer with high carrier concentration, which results in high conductivity, especially for P-type materials. Due to the property of low resistance, the current spreading can be at a better quality, whereby the current would not be confined to the region below the electrode and affect the light emitting efficiency. Moreover, the strained-layer superlattices can have higher carrier concentration, which allows the subsequent transparent electrode to have better ohmic contact. The Schottky contact, due to low carrier concentration, would not occur. The operation voltage for the device can also be reduced. Further still, the strained-layer superlattices and the transparent electrode can have the same conductive type. This also prevent the p-n junction between the strained-layer superlattices and the transparent electrode from occurring. The areas of the transparent electrode and the contact layer can be about the same. FIG. 3 is a cross-sectional view, schematically illustrating a structure of light emitting diode including GaN-based III-N group compound, according to one preferred embodiment of this invention.

In FIG. 3, a substrate 100 is provided first. The substrate 100 includes, for example, sapphire, SiC, ZnO, Si, GaP, GaAs, $Al_2O_3$, or any suitable material. Then a nucleation layer 110 is formed on the substrate 100. The nucleation layer 110 includes, for example, $Al_uIn_vGa_{1-u-v}N$ (u, v≧0; 0≦u+v≦1).

A first-conductive-type buffer layer 120 is formed on the nucleation layer 110. The buffer layer 120 includes, for example, $Al_cIn_dGa_{1-c-d}N$ (c, d≧0; 0≦c+d<1). Generally, it is difficult to directly form a gallium nitride-based epitaxial layer with P-type or N-type on the substrate. This is because the gallium nitride-based semiconductor has poor match of the crystal lattice with the substrate. Usually, a gallium nitride-based compound semiconductor to serve as the nucleation layer 110 and the buffer layer 120 are formed beforehand. In the example, the buffer layer 120 includes, for example, the N-type $Al_cIn_dGa_{1-c-d}N$, so as to improve quality of the crystal growth of gallium nitride-based compound in the subsequent process later, and also increases the production yield.

An electrode 162, serving as a cathode of the light emitting diode, is formed on the buffer layer 120, and is located at a region separated from a lower confinement layer 130, an upper confinement layer 132, and an active layer 140. The electrode layer 162 can include Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/Au, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au, TiWNx/Ti/Au, TiWNx/Pt/Au, TiWNx/Ni/Au, TiWNx/Pd/Au, TiWNx/Cr/Au, TiWNx/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au, or any similar material, all of which have good ohmic contact with the conductive buffer layer, and therefore have smaller contact resistance.

The lower confinement layer 130 is formed on the buffer layer 120, and includes gallium nitride-based compound semiconductor, such as N-type $Al_xIn_yGa_{1-x-y}N$ (x, y≧0; 0≦x+y<1; x>c, where c is the Al content for the buffer layer 120). Dopants for N-type can be chosen by skilled artisans, and are not described here.

An active layer 140 is formed on the lower confinement layer 130. The active layer is a light emitting layer. The active layer includes, for example, the indium gallium nitride based multiple quantum well. In this example, the active layer 140 can be either doped or undoped $Al_aIn_bGa_{1-a-b}N/Al_xIn_yGa_{1-x-y}N$ (a, b≧0; 0≦a+b<1; x, y≧0; 0≦x+y<1; x>c>a, where c is the index for the buffer layer 120) with a quantum well structure. The doping conductive type can be N-type or P-type. The dopants used to form the N-type doping or the P-type doping are well known by skilled artisans An upper confinement layer 132 is formed on the active layer 140. The upper confinement layer 132 can include gallium nitride-based compound semiconductors, such as P-type doped $Al_xIn_yGa_{1-x-y}N$ (x, y≧0; 0≦x+y<1; x>c). The P-type dopants can select from the conventional material known by skilled artisans. The active layer 140 with either N-type or P-type is confined by the lower confinement layer 130 and the upper confinement layer 132. In the foregoing, materials of the gallium nitride-based compound semiconductors, content weight, dopant type, and so on can vary according to the actual design. The above embodiment is only an example for description.

Then, a contact layer 150 is formed over the upper confinement layer 132. The contact layer 150 is one the main features in the invention. According to the present invention, the contact layer includes the material of gallium nitride-based compound semiconductors with high carrier concentration, such as an SLS layer 150. The SLS layer 150 includes, for example, gallium nitride-based compound semiconductors, such as $Al_uIn_vGa_{1-x-y}N/Al_xIn_yGa_{1-x-y}N$ (u, v≧0; 0≦u+v<1; x, y≧0; 0≦x+y<1; x>u). the SLS layer 150 is doped by a mechanism of modulation doped. Moreover, the SLS layer can be doped with N-type dopants or P-type dopants.

A transparent electrode 160 is formed on the contact layer 150. The transparent electrode includes, for example, Ni/Au, TiN, Pd/Au/Pt/Au, and so on. The transparent electrode can also, for example, include N-type transparent conductive oxide layer (TCO), such as ITO, CTO, ZnO:Al, $ZnGa_2O_4$, $SnO_2$:Sb, $Ga_2O_3$:Sn, $AgInO_2$:Sn, $In_2O_3$:Zn, and so on or P-type TCO, such as $CuAlO_2$, LaCuOS, NiO, $CuGaO_2$, $SrCu_2O_2$, and so on. The transparent electrode cal also includes a metal layer of Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$. Generally, the transparent electrode 160 includes a metal layer with a single-layer structure or a multi-layer structure, which structures are common in semiconductor technologies. However, the total thickness of the transparent electrode is preferably about equal to or less than 0.1 microns.

According to the conventional manner, the contact layer usually has the same conductive type with the gallium nitride-based compound semiconductor material. Generally, since the contact layer has contact with the transparent electrode that is formed subsequently, the carrier concentration for the contact layer usually needs a rather high level, such as $1 \times 10^{18}/cm^3$ or higher. However, it is very difficult to grow a P-type contact layer with the carrier concentration level of $1 \times 10^{18}/cm^3$ or higher for the semiconductor bulk of the P-type gallium nitride-based compound, such as p-GaN. In the conventional semiconductor fabrication technologies, if the carrier concentration in the semiconductor material is insufficient, it would have a large contact resistance with the metal electrode. It is even more severe for the P-type semiconductor material.

Figure 5:
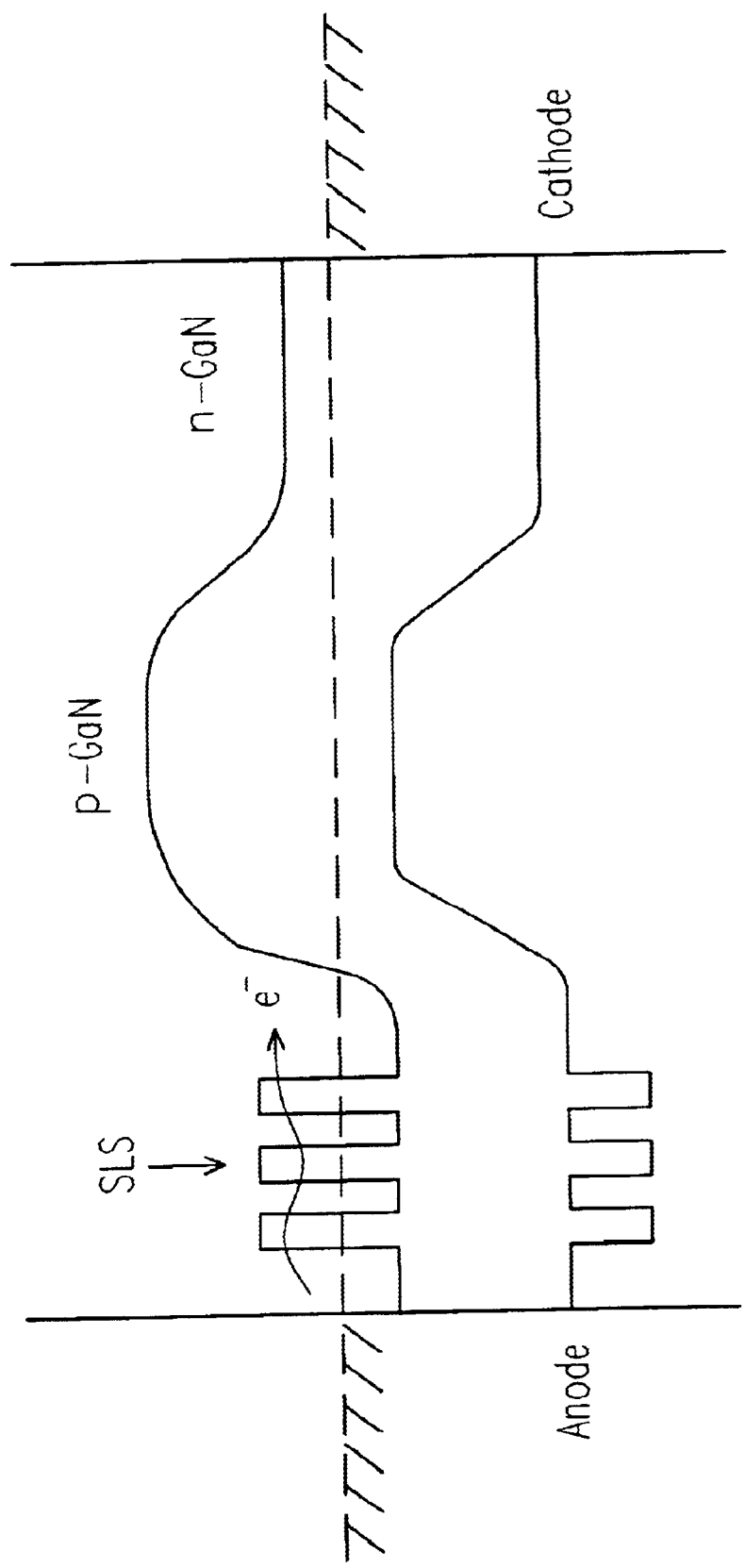
FIG. 5 is a drawing, schematically illustrating a conductive mechanism for the light emitting diode.

Therefore, the present invention introduces the SLS layer with modulation doping property. Using the properties of the strained-layer superlattices structure, the P-type gallium nitride-based contact layer with high carrier concentration level can be easily grown thereon. The band structure between the gallium nitride-based material in the SLS structure is affected by the strain, so that the Fermi level is closer to the valence band. Therefore, the dopants can be easily activated, so as to increase the carrier concentration level, which can achieve the level of $1 \times 10^{18}/cm^3$. It can even achieve to $1 \times 10^{19}/cm^3$ or higher for the P-type gallium nitride-based material. The SLS structure has sufficient advantage for choice as the contact layer. In addition, as the carrier concentration is sufficiently high, the carriers can directly transport through the energy barrier due to the tunneling effect. The contact layer therefore can be having different conductive type from the upper confinement layer. The P-N junction is prevented from occurring. For example, if the upper confinement layer is P-type, the contact layer can be either N-type or P-type. The mechanism for energy band for conduction is shown in FIG. 5.

Figure 4:
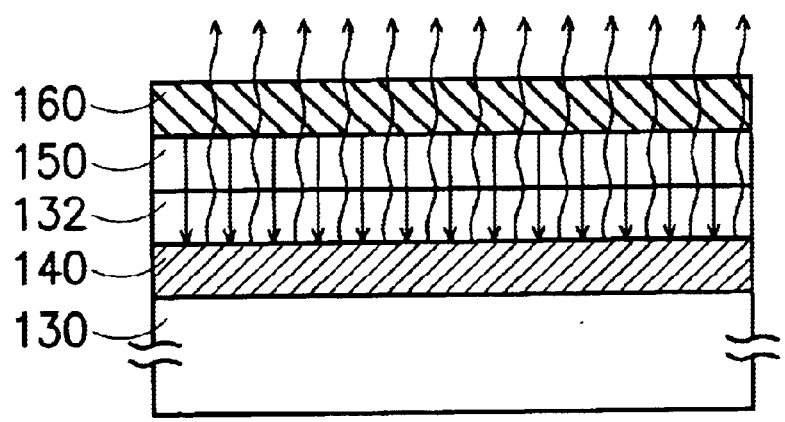
FIG. 4 is a cross-sectional views, schematically illustrating a light emitting region for the light emitting diode in FIG. 3, according to one preferred embodiment of this invention.

Since the SLS layer is used as the contact layer 150 with the transparent electrode 160, the ohmic contact between them has good quality. Moreover, the transparent electrode layer can be formed with an area about equal to the area of the contact layer. Therefore, the structure of the present invention can even increase the current, which flows through the whole active layer 140 and the area of transparent electrode layer. In FIG. 4, when the anode 160, that is, the transparent electrode of the light emitting diode and the cathode 162 are applied with a forward bias, all light generate by the whole active layer 140 emits through the transparent electrode, and extracts outwardly. This means that the structure of the invention has larger light emitting area than the conventional light emitting area. Since the invention uses the SLS layer to serve as the contact layer associating with the transparent electrode, the light emitting efficiency for the light emitting device is greatly improved.

Further still, due to use of the properties of strained-layer superlattices, the transparent electrode 160 and the contact layer 150 of strained-layer superlattices can include materials with the same conductive type. For example in the embodiment, the contact layer 150 of strained-layer superlattices includes the P-type material of $Al_uIn_vGa_{1-u-v}N/Al_xIn_yGa_{1-x-y}N$, and the transparent electrode 160 includes P-type material of $CuAlO_2$, LaCuOS, $CuGaO_2$, $SrCu_2O_2$, and so on. The contact layer 150 of strained-layer superlattices can also includes the N-type material of $Al_uIn_vGa_{1-u-v}N/Al_xIn_yGa_{1-x-y}N$, and the transparent electrode 160 includes N-type material of ITO, CTO, $AgInO_2$ or $In_2O_3$:Zn. In this situation, since the transparent electrode 160 and the contact layer 150 has the same conduction type, there is no rectified junction occurring. As comparing with the convention method, the conventional method restricts that the contact layer should use the P-type material of gallium nitride-based compound semiconductor, while the transparent electrode is N-type material, such as ITO or CTO. Due to the different conduction type between the transparent electrode and the contact layer, the P-N junction might occur in the conventional method, and affects the operation of the device. This is particularly due to the insufficient carrier concentration of contact layer.

In summary, the structure of the light emitting diode in the present invention at least has advantages as follows:

The structure of the light emitting diode in the present invention uses the modulated doped process associating with the properties of strained layer superlattices material to form contact layer of the gallium nitride-based light emitting diode. The carrier concentration of the contact layer can be effectively and easily increased up to $1 \times 10^{18}$ atoms/$cm^3$ or even higher.

The structure of the light emitting diode in the present invention uses the doped strained-layer superlattices to serve as the contact layer of the gallium nitride-based light emitting diode. The transparent electrode has better quality of ohmic contact, and the area of the transparent electrode can be about the same as the area of the contact layer. This features improve the area of the active layer where current can flow through. The effective light emitting area of the active layer is increased, and thereby the light emitting efficiency is greatly improved and the operation voltage for the device is reduced.

The structure of the light emitting diode in the present invention uses the doped strained-layer superlattices to serve as the contact layer of the light emitting diode. The conductive type of the contact layer can be freely chosen depending on the actual design. That is, the transparent electrode and the contact layer can be having the same conductive type or different conductive type. If the option of taking same conductive type, the P-N junction between the contact layer and the transparent electrode, which occurring in the conventional manner, can be avoided.

Figure 6:
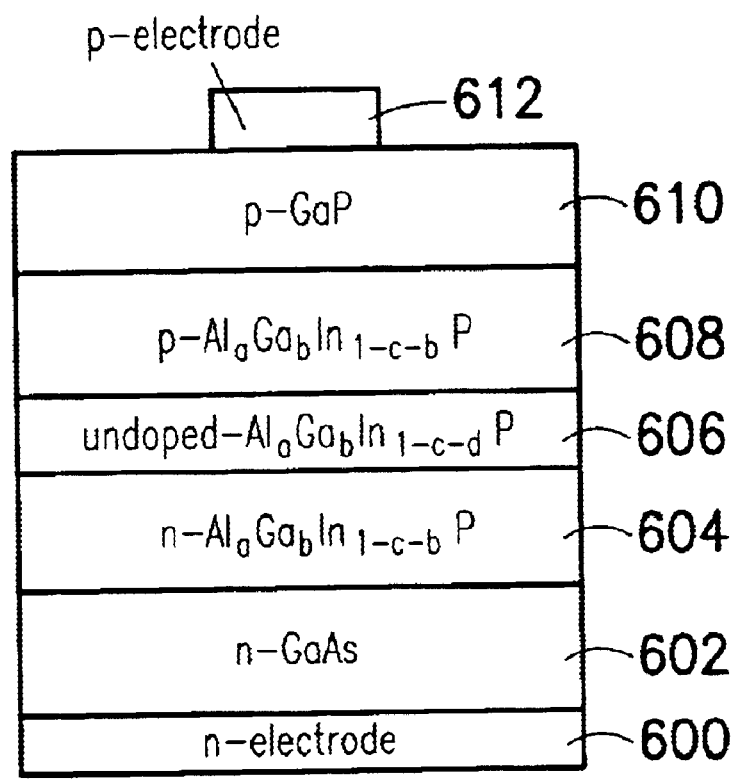
FIG. 6 is a cross-sectional drawing, schematically illustrating a conventional light emitting diode.
Figure 7:
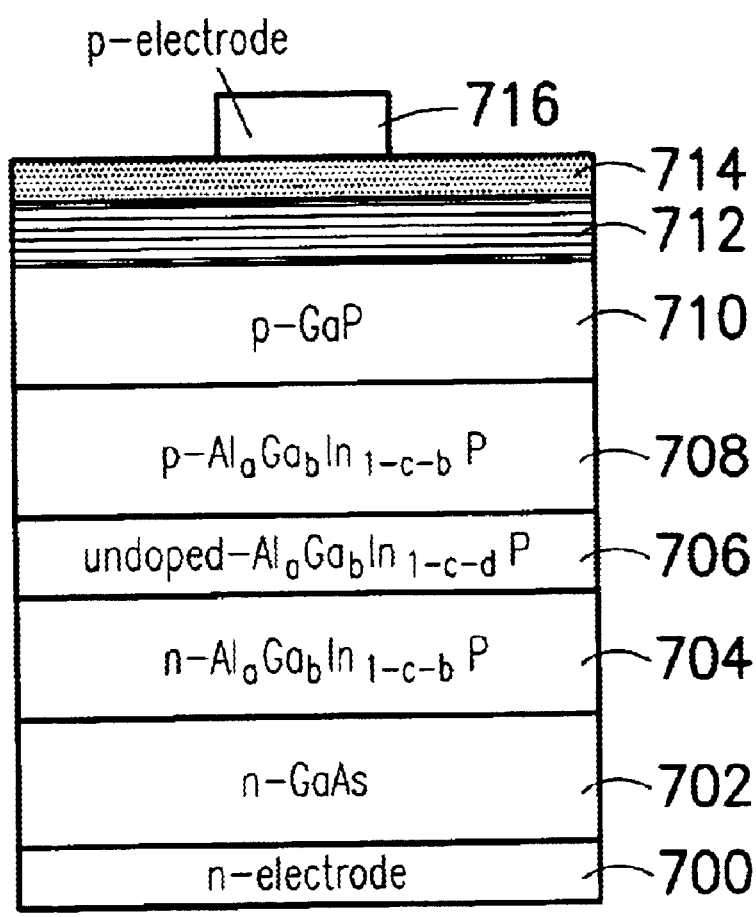
FIGS. 7–8 are cross-sectional drawings, schematically illustrating another structure of light emitting diode, according to the preferred embodiments of the invention.

In considering the conventional LED structure in FIG. 6, the invention also introduce improved structure to enhance the light emitting efficiency by improving the effective contact area for the p-electrode. In FIG. 7, a substrate layer 702, like the substrate 100 in FIG. 3, is used. An n-electrode layer 700 is formed on the back side of the substrate layer 702 while a confinement layer 704 is formed on the upper side of the substrate layer 702. An active layer 706 is formed over the confinement layer 704. Another confinement layer 708 is formed over the active layer 706. Another substrate layer 710 is formed over the confinement layer 708. Here, the substrate layer 710 is, alternatively, a semiconductor layer. The materials for the confinement layers 704 can be, for example, n-$Al_aGa_bIn_{1-a-b}P$, or other similar material. Likewise, the materials for the confinement layers 708 can be, for example, p-$Al_nGa_bIn_{1-a-b}P$, or other similar material. The active layer can include, for example, undoped-$Al_cGa_dIn_{1-c-d}P$, or material with multiple quantum well, such as $Al_aGa_bIn_{1-a-b}P/Al_cGa_dIn_{1-c-d}P$, where a, b$\geq$0; 0$\leq$a+b$\leq$1; c, d$\geq$0; 0$\leq$c+d$\leq$1; a>c. The conductive type is different at two sides of the active layer 706, so as to form a main structure of the LED. Desired light is emitted by applying the current through the active layer. The light emitting mechanism is quantum phenomenon and known in the art. The number of active layer may be greater than one, so as to produce the desired color light. Then, the structure can be varied according to the desired light. This part of structure can be referred to a main LED structure.

In order to have better light emitting efficiency, a SLS layer, serving as a contact layer, is formed over the substrate layer 710. A transparent conductive layer 714, such as ITO, CTO, etc., is formed over the SLS layer 712. Then a p-electrode 716 is formed on the conductive layer with a small contact portion. The conductive type for the electrode and the contact layer are set to be different, such as the n-type SLS layer, associating with the p-electrode. In this structure, the transparent conductive layer 714 can be coupled to the substrate layer 710 via the SLS layer 712 by a large area. As a result, the effective area for light emitting is large. Also and, since the SLS layer 712 provide the tunneling effect, that carriers can be easily transited to the confinement layer 708. The light emitting efficiency is then greatly improved.

Figure 8:
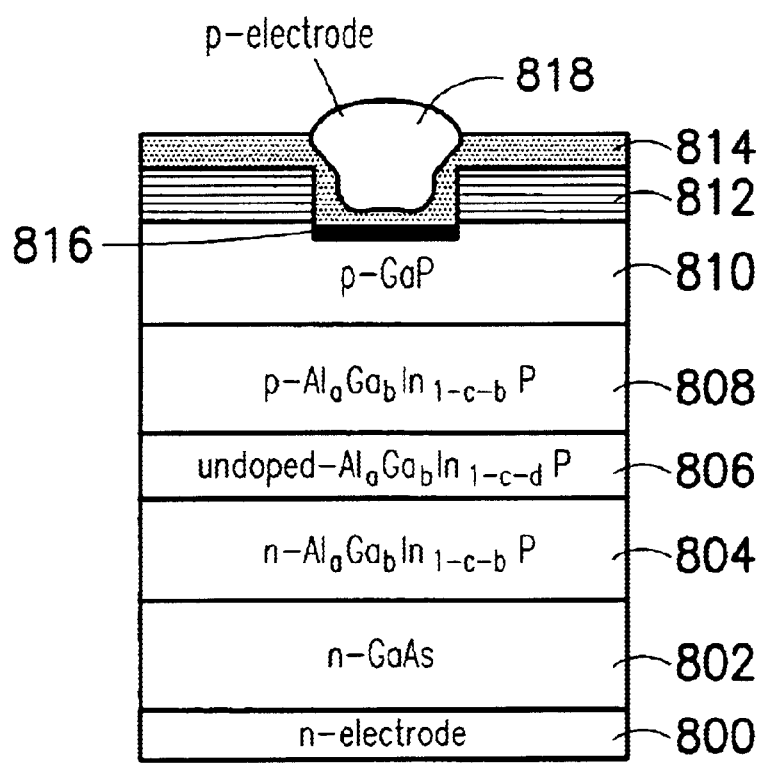

Further still, with the advantages of using the SLS layer, the structure in FIG. 7 can be further modified to further improve the light emitting efficiency. In FIG. 8, a substrate layer 802 is used. An n-electrode layer 800 is formed on the back side of the substrate layer 802 while a confinement layer 804 is formed on the upper side of the substrate layer 802. An active layer 806 is formed over the confinement layer 804. Another confinement layer 808 is formed over the active layer 806. Another substrate layer 810 is formed over the confinement layer 808.

The difference of the structure in FIG. 8 from that in FIG. 7 is as follows. After the substrate layer 810 is formed. Here, the substrate layer 810 is, alternatively, a semiconductor layer. An SLS layer 812, serving as a contact layer, and a transparent conductive layer 814 are sequentially formed over the substrate layer 810. However, the SLS layer 812 has an opening to expose the substrate layer 810. In this manner, the transparent conductive layer 814 contacts the substrate layer 810 within the opening, in which a Schotty barrier rectifier junction 816 is created at the contact region. In this structure, the current flowing through the region under the Schotty barrier rectifier junction 816 is reduced. Then, the current is distributed into the other area, resulting in a better light emitting efficiency. Therefore, the light emitting efficiency is further improved when comparing with the structure in FIG. 7.

However, in the foregoing descriptions, the substrate layers 710 and 810 are not absolutely required and can be omitted. Then, if the substrate layers 710 and 810 are omitted, the confinement layers 708 and 808 are the layers in contact with the SLS layers 712 and 812 respectively. Also and, the substrate layers 710 and 810 can be simply considered as the semiconductor layers.

Also and, since the opening of the conductive layer 814 produces a concave region, the p-electrode 818 can be formed to fill into the concave region. This can also avoid an electrode island in FIG. 6. The mechanical contact strength of the p-electrode 818 to the conductive layer 814 can also be improved. The total thickness of the LED can also be reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A structure of light emitting diode, comprising:
    a substrate;
    a first electrode layer on a back side of the substrate;
    a first confinement layer, formed over an upper side of the substrate;
    an active layer, formed over the first confinement layer, wherein the active layer comprises a doped III-V group compound semiconductor;
    a second confinement layer, formed over the active layer;
    a contact layer, formed on the second confinement layer;
    a transparent conductive layer, formed over the contact layer; and
    a second electrode layer, formed on the transparent conductive layer.

2. The structure of light emitting diode of claim 1, wherein the contact layer comprises a strained-layer superlattices, which has a different conductive type from the second confinement layer.

3. The structure of light emitting diode of claim 1, wherein the contact layer has an opening to expose the second confinement layer, and the conductive layer has a contact portion on the second confinement layer within the opening.

4. The structure of light emitting diode of claim 3, wherein the second electrode layer fill into a concave region, which is formed due to the opening of the contact layer.

5. The structure of light emitting diode of claim 2, wherein the contact layer has an opening to expose the second confinement layer, and the conductive layer has a contact portion on the second confinement layer within the opening.

6. The structure of light emitting diode of claim 5, wherein the second electrode layer fill into a concave region, which is formed due to the opening of the contact layer.

7. A structure of light emitting diode (LED), comprising:
    a main LED structure, wherein the main LED substrate at least include one active layer and a first electrode layer;
    a contact layer, formed on the main LED structure;
    a transparent conductive layer, formed over the contact layer; and
    a second electrode layer, formed on the transparent conductive layer.

8. The structure of LED of claim 7, wherein the contact layer comprises a strained-layer superlattices, which has a different conductive type from the transparent conductive layer.

9. A structure of light emitting diode (LED), comprising:
    a main LED structure, wherein the main LED substrate at least include one active layer and a first electrode layer;

a contact layer, formed on the main LED structure, wherein the contact layer has an opening to expose the main LED structure;

a transparent conductive layer, formed over the contact layer, wherein the transparent conductive layer has a contact portion on the main LED structure within the opening; and an electrode layer, formed on the transparent conductive layer above the opening.

10. The structure of LED of claim 9, wherein the contact layer comprises a strained-layer superlattices, which has a different conductive type from the transparent conductive layer.

11. The structure of LED of claim 9, wherein a Schotty barrier rectifier junction is formed at the contact portion between the transparent conductive layer and the main LED structure.

12. The structure of LED of claim 9, wherein the conductive layer has a concave region with respect to the opening of the contact layer, whereby the second electrode layer fills the concave region.

13. The structure of light emitting diode of claim 1, wherein the contact layer comprises a strained-layer superlattices, which has a different conductive type from the transparent conductive layer.

* * * * *